United States Patent [19]

Hazani

[11] Patent Number: 4,763,299
[45] Date of Patent: Aug. 9, 1988

[54] E²PROM CELL AND ARCHITECTURE

[76] Inventor: Emanuel Hazani, 1210 Sesame Dr., Sunnyvale, Calif. 94087

[21] Appl. No.: 787,279

[22] Filed: Oct. 15, 1985

[51] Int. Cl.⁴ .................. G11C 13/00; G11C 11/42
[52] U.S. Cl. ................................. 365/51; 365/189
[58] Field of Search ..................... 365/51, 189, 230

[56] References Cited

U.S. PATENT DOCUMENTS 4,122,544 10/1978 McElroy .
4,267,558 5/1981 Guterman .
4,302,766 11/1981 Guterman et al. .
4,361,847 11/1982 Harari .

OTHER PUBLICATIONS

Novram Reliability Report, Billy Kwong, Dr. John Caywood, Thurs., Feb. 14, 1985.
Electronics Week, p. 57, Fig. 8, Feb. 11, 1985.
Guterman et al., "An Electronically Alterable Nonvolatile Memory Cell Using a Floating-Gate Structure", IEEE J. Solid-State Circuits, vol. Sc-14, No. 2, pp. 498-508, Apr. 1979.

Primary Examiner—Terrell W. Fears
Attorney, Agent, or Firm—Townsend and Townsend

[57] ABSTRACT

An architecture and memory cell of an E²PROM array, and a process for forming a cell. The cell includes a channel oriented at 45° relative to the bit lines of the array. A diffusion region in the architecture function as a terminal for four memory cells. The process for forming a cell provides for a floating gate having asperities on an erase segment but not on a programming segment.

6 Claims, 5 Drawing Sheets

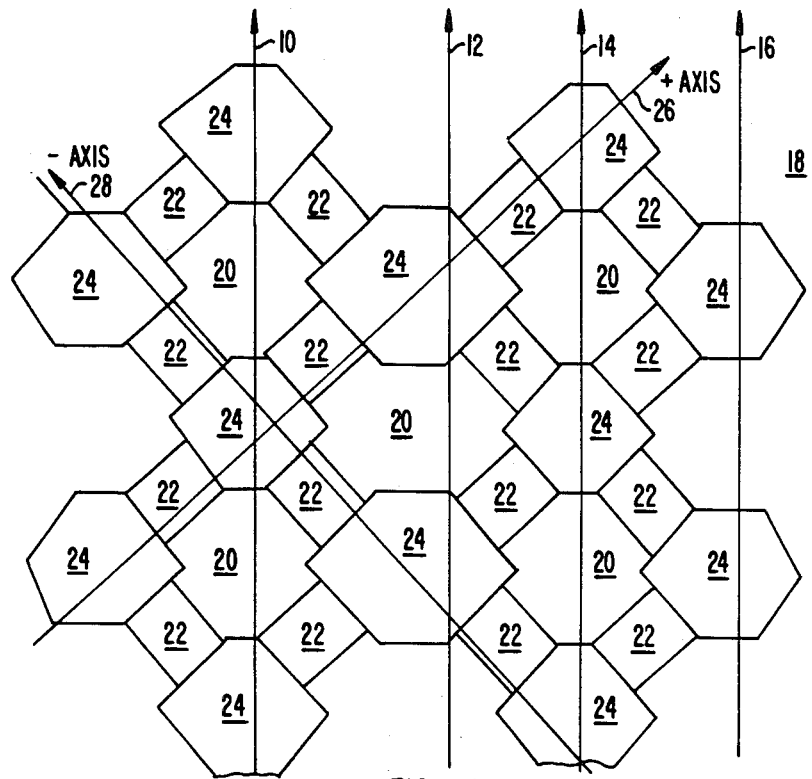
FIG._1.
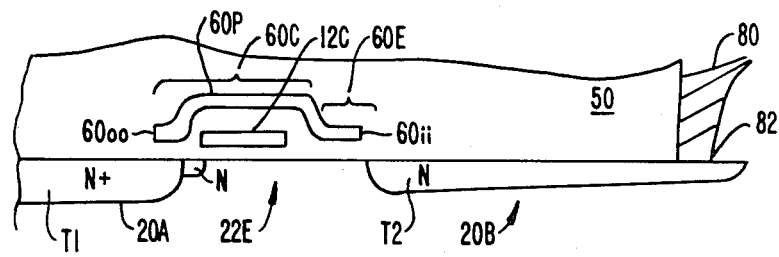
FIG._3.
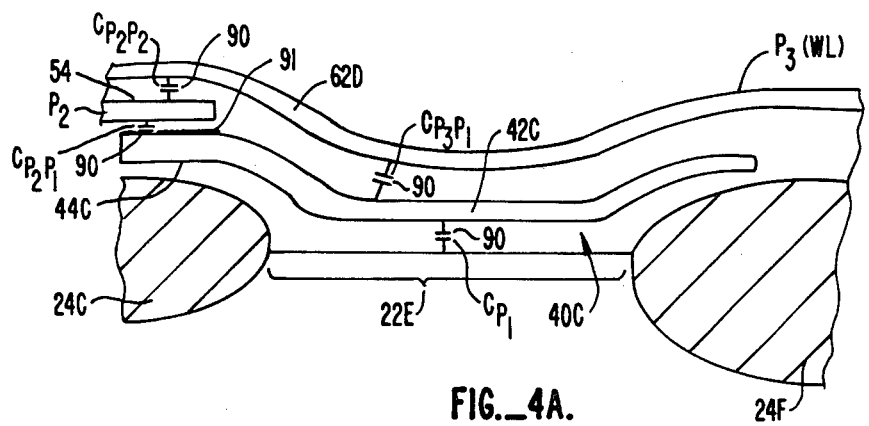
FIG._4A.

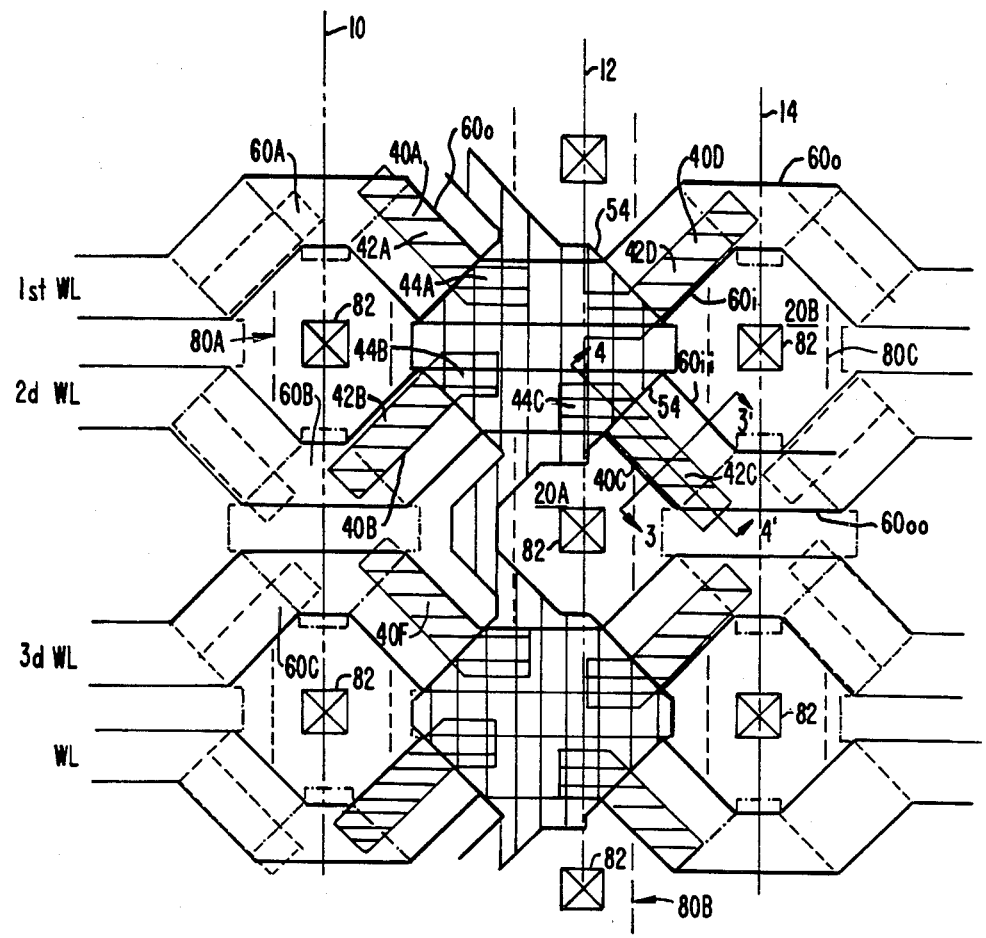
FIG._2.
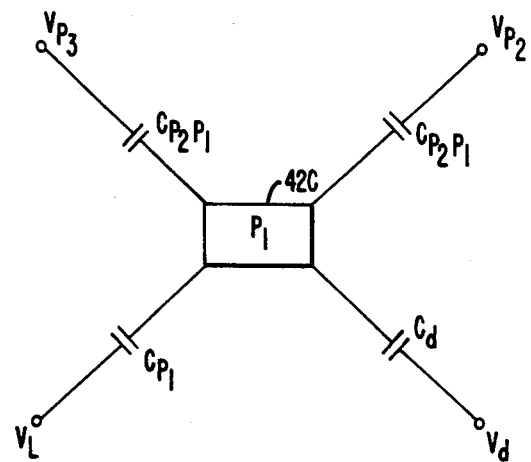
FIG._4B.

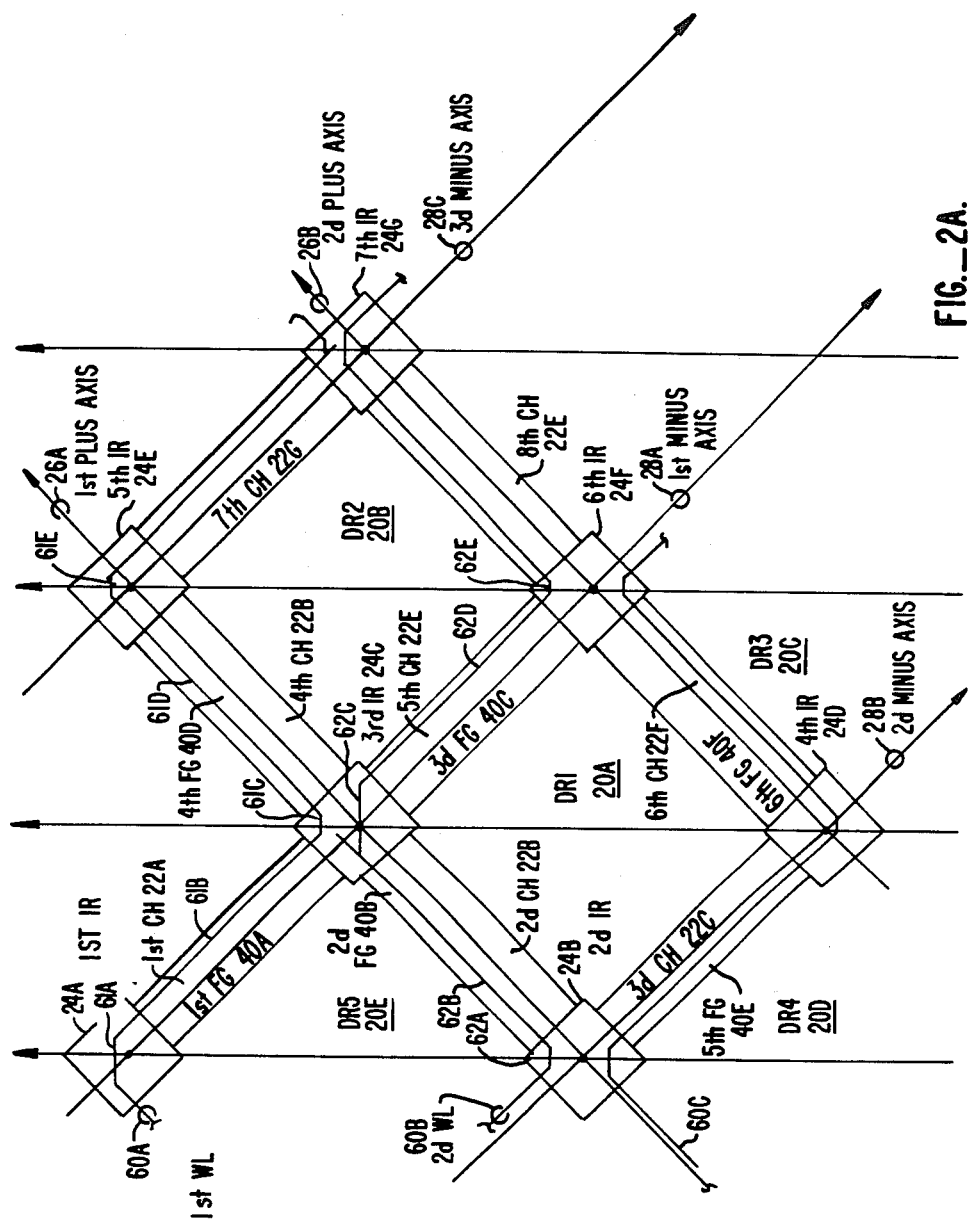
FIG._2A.

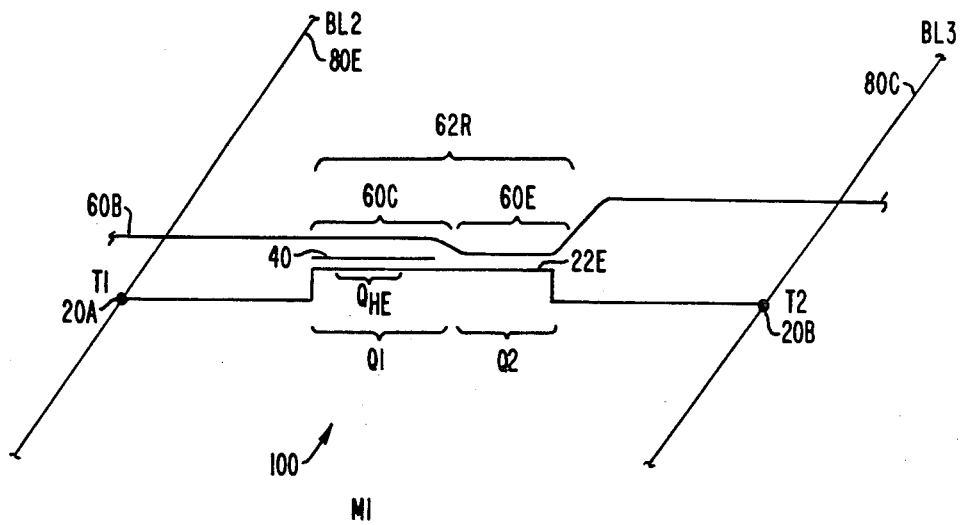
FIG._5.
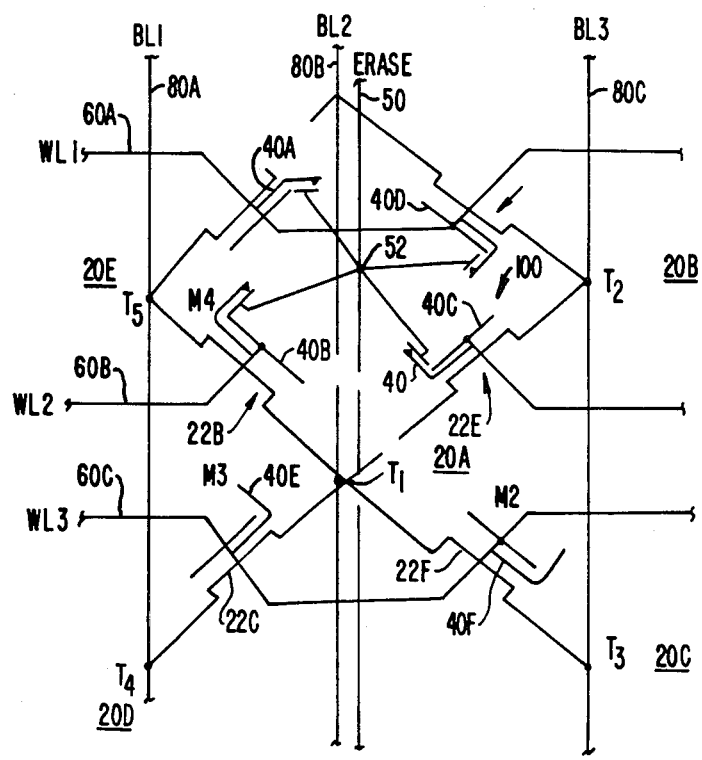
FIG._6.

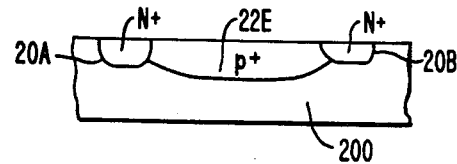
FIG._7.
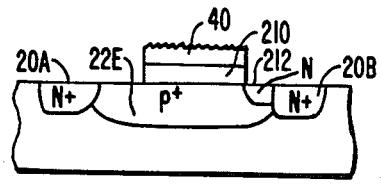
FIG._8.
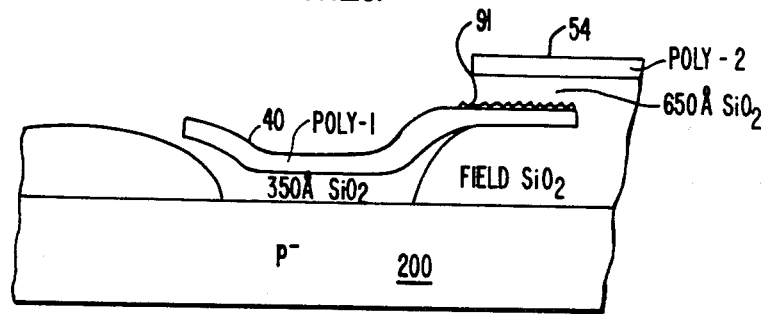
FIG._9.
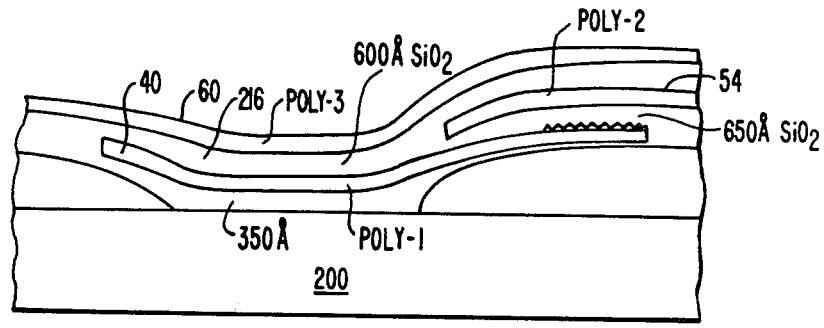
FIG._10.

$E^2$PROM CELL AND ARCHITECTURE

BACKGROUND OF THE INVENTION

1. Field of the Invention

The present invention relates generally to semiconductor memory cells and architectures and, more particularly, relates to a cell and architecture for an electrically erasable programmable read-only memory ($E^2$PROM)

2. Description of the Relevant Art

The potential for $E^2$PROM memory arrays to replace standard nonvolatile memory devices, such as disks, tapes, etc., has stimulated research into new architectures for $E^2$PROMs. As is well known, the cost associated with electronic nonvolatile memories facilitated on integrated circuit (IC) semiconductor chips are much less than associated with memories requiring mechanical components. However, at present $E^2$PROM memory architectures have not achieved great commercial success.

Typical $E^2$PROM memory cells are complex structures requiring the precise positioning of diffusion regions, oxide isolation regions, thin oxide layers, and polycrystalline silicon elements. Additionally, the various voltage levels required for read, program, and erase operations require connecting lines to provide externally-generated voltage levels. Accordingly, the density, or number of memory cells/unit area, of existing $E^2$PROM architectures is low.

The program and erase operations in an $E^2$PROM generally require high voltage levels to charge and discharge the floating gates in the $E^2$PROM cells. These high voltage levels are difficult to generate on the IC chip, make isolation of the diffusion regions on the surface of the chip difficult, and cause bipolar latch-up problems in CMOS peripheral circuits on the chip.

Further, $E^2$PROM capacitance of the word lines and bit lines in these arrays is generally large. These bit lines and word lines must be charged to selected bias voltage levels during a read operation. The high capacitance increases the time required to bias the word lines and bit lines and decreases the speed of the memory array Read Access Time.

Accordingly, an $E^2$PROM architecture that is fast, facilitates high density, and does not require high voltage levels during the program and erase operations is greatly needed in the semiconductor industry.

SUMMARY OF THE INVENTION

The present invention is a novel $E^2$PROM cell and architecture formed on a silicon substrate and a method for forming the cell.

The architecture provides for an $E^2$PROM array of much higher density than existing architectures. In one embodiment, a set of bit lines are aligned parallel a vertical bit line axis. The channels of the $E^2$PROM cells are aligned along channel axes oriented ±45° from the bit line axis. The word lines of the array form a zigzag pattern with the word lines having horizontal segments and segments aligned along the channel axes.

This zigzag pattern facilitates the use of a single terminal region, diffused into the substrate, as a terminal for four $E^2$PROM cells. Additionally, a single erase region may be utilized to erase four cells. These architectural features provide for a high density array.

The density of the array requires that the programming and erase voltages be lower than in existing systems. These lower voltages result from several unique aspects of the present system.

According to one aspect of the invention, the erase segment of the floating gates of the array are disposed below the erase region of an erase polysilicon layer. The upper surface of a poly region tends to be convex and the lower surface tends to be concave. The voltage difference to cause electron tunneling from a convex to a concave surface is lower than required to cause tunneling from a concave to a convex surface. Accordingly, positioning the erase segments below the erase region reduces the required erase voltage level.

Secondly, the presence of bumps or asperities on the surface of poly regions reduces the required tunneling potential difference. Thus, it is desirable to have asperities on the surface of the erase segment of the floating gates. However, tunneling from the floating gate to the word line is not desired.

According to a further aspect of the invention, for each floating gate, the upper surface and edges of the programming segment, disposed below the word line, is smoother than the upper surface of the erase segment.

According to a further aspect of the invention, a novel process includes the steps of making the upper surface of the programming segment smoother than the upper surface of the erase segment.

Several of the above-described features also reduce the bit line and word line capacitance of the array and therefore decrease the read access time.

In particular, the reduced number of diffusion regions reduces the bit line capacitance. Additionally, the horizontal segments of the word lines are disposed oxide isolation regions thereby reducing the word line capacitance.

An additional advantage of the present system is the reduction of misalignment problems during fabrication. The orientation of the channels along the channel axes reduces the effect on misalignment. Accordingly, the $E^2$PROM array of the present invention has greater density and a shorter access time than existing systems. Further features and advantages of the present invention will become apparent in view of the drawings and following detailed description.

BRIEF DESCRIPTION OF THE DRAWINGS

FIG. 1 is a plan view of the disposition of various regions of the architecture on the surface of a silicon substrate.

FIG. 2 is a plan view of the floating gates, erase polysilicon structure, and word lines of the $E^2$PROM array positioned relative to the structures depicted in FIG. 1.

FIG. 2A is a plan view of the architecture illustrating the labelling of the various components.

FIG. 3 is a cross-sectional view, taken along line 3—3' of FIG. 2, an embodiment of the $E^2$PROM cell.

FIG. 4A is a cross-sectional view, taken along the line 4—4', of the structure depicted in FIGS. 1 and 2.

FIG. 4B is a circuit diagram corresponding to the physical structure depicted in FIG. 4A.

FIG. 5 is a schematic diagram of a memory transistor.

FIG. 6 is a circuit diagram corresponding to the architecture depicted in FIGS. 1-4.

FIGS. 7-10 are cross-sectional views depicting processing steps for fabricating an embodiment of the invention.

DETAILED DESCRIPTION OF THE PREFERRED EMBODIMENTS

The present invention is an E²PROM cell and array architecture. The structure of the array will now be described with reference to FIGS. 1 through 4.

The array is constructed over the surface of a P type silicon substrate. FIG. 1 is a top view of the surface of the silicon substrate depicting the various regions of the array formed on the surface. It is to be understood that the section of the array depicted in FIG. 1 can be indefinitely extended in all directions depending on the desired size of the array.

In FIG. 1, first, second, third, and fourth bit line (BL) axes 10, 12, 14, and 16, define a vertical direction, or Y axis, along the planar surface 18 of the silicon substrate. A number of N type diffusion terminal regions 20 are disposed alone each BL axis 10, 12, 14, and 16. These diffusion regions are substantially symmetrical about the BL axes 10, 12, 14, and 16.

A number of rectangular channels 22 are also formed on the surface 18 of the substrate. These channels are P type or P+ type diffusions formed along the surface 18 of the substrate. Each channel 22 is substantially rectangular with the long edges of the channel 22 adjacent to a diffusion region 20.

A number of field oxide isolation regions 24 are disposed along each bit line axis 10, 12, 14, and 16. Each isolation region 24 is substantially symmetrical about a BL axis. The isolation regions under the second and fourth BL axes 12 and 16 are larger than the isolation regions under the first and third BL axes 10 and 14 for reasons described fully below.

The channels 22 are divided into two groups. The first group, denoted the plus group, have their lengthwise edges aligned parallel to plus axes 26 oriented at +45 degrees to the BL axes 10, 12, 14, and 16. A second set of channels, denoted the minus set, have their lengthwise edges oriented parallel to minus axes 28 disposed at a −45° angle to the BL axes 10, 12, 14, and 16. Each channel 22 is terminated by isolation regions 24.

A given isolation region 24 penetrates into the surface 18 of the substrate and electrically isolates the channels 22 and diffusion regions 20 adjacent to the isolation region 24. Each diffusion region 20 is bordered by four channels 22 and four isolation regions 24. The PN junctions formed between the P type channel and N type diffusion region in combination with the field oxide isolation regions 24 electrically isolate the diffusion regions 20 from each other.

Note that diffusion regions 20 and isolation regions 24 positioned along adjacent BL axes are positioned along the plus or minus axes 26 and 28. Also, diffusion regions 20 or isolation regions 24 disposed along alternate BL axis are oriented along a horizontal axis 30.

FIG. 2 is a top view of the structure depicting the shape and orientation of three polysilicon layers formed over the surface regions depicted in FIG. 1. These layers are vertically displaced from the surface 18 of the substrate and from each other by oxide regions. These oxide regions will be more fully described with reference to FIGS. 3 and 4 which are cross-sectional views.

Referring now to FIG. 2, a floating gate 40 is partially disposed over each channel 22. Each floating gate includes a rectangular programming section 42 disposed over the channel 22 and an erase section 44 disposed over an isolation region 24. The floating gates 40 are arranged so that the erase sections 44 from four floating gates 44 are disposed over a single one of the large isolation regions 24L disposed along the second BL axis 12. The floating gates 40 are part of a polycrystalline silicon (poly 1) layer. The floating gates 40 are formed from a poly 1 layer disposed over the surface of the entire substrate by standard photolithographic steps well known in the art.

A series of erase lines 50 are formed from a second polycrystalline silicon (poly 2) layer. Each erase line 50 includes an erase region 54 disposed over the large isolation regions 24L and a connecting region 56 disposed over the diffusion regions 20 aligned along the second BL axis 12. A single erase region 54 of the erase line 50 is disposed over the erase segments 44 of four different floating gates 40.

For ease of description, the components depicted in FIG. 1 will be labeled. FIG. 2A is a schematic diagram illustrating the labelling system. First and second isolation regions are disposed along the first BL axis 10, third and fourth isolation regions 24C and 24D are disposed along the second BL axis 12, fifth and sixth isolation regions 24E and 24F are disposed along the third BL axis 14, and a seventh isolation region 24G is disposed along the fourth BL axis 16.

A first minus axis 28A passes through the first, third, and sixth isolation regions 24A, 24C, and 24F, a second minus axis 28B passes through the second and fourth isolation regions 24B and 24D and a third minus axis 28C passes through the fifth and seventh isolation regions 24E and 24G.

A first plus axis 26A passes through the second, third, and fifth isolation regions, 24B, 24C, and 24E, a second plus axis 26B passes through fourth, sixth, and seventh isolation regions, 24D, 24F, and 24G.

The first channel 22A is oriented along the first minus axis 28A and is terminated by the first and third isolation regions 24A and 24C; the second channel 22B is oriented along said first plus axis 26A and is terminated by the second and third isolation regions 24B and 24C; the third channel 22C is oriented along the second minus axis 28B and is terminated by the second and fourth isolation regions 24B and 24D; the fourth channel 22D is oriented along the first plus axis 26A and is terminated by the third and fifth isolation regions 24C and 24E; the fifth channel 22E is oriented along the first minus axis 28A and is terminated by the third and sixth isolation regions 24C and 24F; the sixth channel 22F is oriented along the second plus axis 26B and is terminated by the fourth and sixth isolation regions 24D and 24F; the seventh channel 22G is oriented along the third minus axis 28C and terminated by the fifth and seventh isolation regions 24E and 24G; the eighth channel 22H is oriented along the second plus axis 26B and is terminated by the sixth and seventh isolated regions 24F and 24G.

A first floating gate 40A has its programming segment 42A disposed above the first channel 22A and its erase segment 44A disposed above the third isolation region 24C; the second floating gate 40B has its programming segment 42B disposed above the second channel 22B and its erase segment 44B disposed over the third isolation region 24C; the third floating gate 40C has its programming segment 42C disposed above the fifth channel 22E and its erase segment 44C disposed over the third isolation region 24C; the fourth floating gate 40D has its programming segment disposed over the fourth channel 22D and its erase segment 44D disposed over the third isolation region 24C; the fifth floating gate 40E has its programming segment 42E disposed over the third channel 22C and its erase segment disposed over fourth isolation region 24D; and the sixth floating gate 40F has its programming segment 42F disposed over the sixth channel 22F and its erase segment 42F disposed over the fourth isolation region 24D.

A first N+ diffusion region 20A is bounded by the second, third, sixth, and fifth channels 22B, 22C, 22F, and 22E, and by the second, fourth, sixth, and third isolation regions 24B, 24D, 24F, and 24C. A second diffusion region 20B is bonded by the fourth, fifth, eighth, and seventh channels 22D, 22E, 22H, and 22G, and by the third, sixth, seventh, and fifth isolation regions 24C, 24F, 24G, and 24E.

A third diffusion region 20C is positioned across the 6th channel 22F from the first diffusion region 20A, a fourth diffusion region 20D is positioned across the 3rd channel 22C from the first diffusion region 20A; and, a fifth diffusion region 20E is positioned across the 2nd channel 22B from the first diffusion region 20A.

The word lines 60 are formed from a third poly (poly 3) layer disposed above the first and second poly layers and includes a first word 60A has a first horizontal segment 61A disposed over the first isolation region 24A, a second segment 61B disposed over the first channel 22A, a third horizontal segment 61C disposed over the third isolation region 24C, a fourth segment 61D disposed over the fourth channel 22D, and a fifth horizontal segment 61E disposed over the fifth isolation region 24E. The first word line 60A has an inside edge, 60i adjacent to the second diffusion region 20B, and an outside edge 60o. (See FIG. 2.)

Second word line 60B has a first horizontal segment 62A disposed over the second isolation region 24B, a second segment 62B disposed over the second channel 22B, a third horizontal segment 62C disposed over the third isolation region 24C, a fourth segment 62D disposed over the fifth channel 22E, and a fifth horizontal segment 62E disposed over the sixth isolation region 24F. The second word line 60B has an inside edge 60ii disposed adjacent to the second diffusion region 20B and an outside edge 60oo. (See FIG. 2.)

Referring back to FIG. 2, the programming segment 42A of the first floating gate 40A is disposed closest to the outside edge 60o of the first word line 60A while the programming segment 42D of the fourth floating gate 40D is disposed closest to inside edge 60i of the first word line 60A. This alternate positioning of the program segments of the floating gates 40 relative to the edges of the word lines 60 is an important feature of the invention. The functional significance of this positioning is described more fully below. The programming segments 40A of the floating gates 40 are also positioned over the channels 22 surrounding a given diffusion region in a special manner.

If the channels bordering the first diffusion region 20A are examined in a clockwise fashion, the programming segments of the floating gates 40 are alternately positioned relative to the junction formed between the first diffusion region 20A and the channels 22. The third floating gate 40C has its programming segment 42C positioned adjacent to the first diffusion region 20A/5th channel 22E interface, the sixth floating gate 40F has its programming segment positioned away from the first diffusion region 20A/6th channel 22F interface, and so on.

Metallic BLs 80 are positioned above the word lines 60 and are aligned along the bit line axes 10, 12, 14, and 16. The bit line 80 aligned along the first LB axis 10 is termed the first bit line 80A, the bit line 80 aligned along the second BL axis 12 is termed the second bit line 80B, and so on. These BLs are coupled to the diffusion regions 20 at connecting points 82. An erase line (poly 2) layer 50 is positioned under every other bit line 80. For example, in FIG. 2, a poly 2 layer 50 is disposed under the second BL 80B, but not under the first and third BLs 80A and 80C. The connecting regions 56 of the poly 2 layer 50 dogleg around the BL connections 82.

FIG. 3 is a cross sectional view taken along line 3,3' of FIG. 2, of a preferred embodiment of the E²PROM cell of the present invention. Referring now to FIG. 3, the first and second diffusion regions 20A and 20B are separated by the fifth channel 22E. The programming section 42C of the third floating gate 40C is disposed over the channel 22E and is positioned closer to the first diffusion region 20A than to the second diffusion region 20B. The word line segment 62D of the second word line 60B is divided into two sections. The first section 60C is a programming control section and the second section 60E is an enhancement section. BL contact 82 couples the second diffusion region 20B to the third bit line 80C.

The poly structures, the floating gate 40, the word line 60, are separated from the substrate and from each other by silicon dioxide. The present embodiment, the thickness of the oxide separating the floating gate from the substrate, is 350 Angstroms, the thickness of the oxide separating the control gate 60C from the floating gate 40 is 650 Angstroms.

FIG. 4A is a cross-sectional view of the embodiment depicted in FIGS. 1 and 2 taken along line 4—4'. Referring now to FIG. 4A, the fifth channel 22E is positioned between the third and sixth isolation regions 24C and 24F. The programming section 42C of the third floating gate 40C is disposed over the channel 22E and the erase segment 44C is disposed over the third isolation region 24C. The erase region 54 of the poly 2 layer 50 is disposed over the erase section 44C of the floating gate 40C. The fourth segment 62D of the second word line 60B is disposed over the program region 42C of the third floating gate 40C. The thickness of the oxide between the word line segment 62D (poly 3) and the floating gate 40C (poly 1) is approximately 600 Angstroms, the thickness between floating gate erase section 44C (poly 1) and the erase region (poly 2) is approximately 650 Angstroms, and the thickness between the programming section 42C (poly 1) and the substrate is about 350 Angstroms.

FIG. 4B is a circuit diagram corresponding to the physical structure depicted in FIG. 4A. The symbols in FIG. 4A are defined as follows:

$V_{p1}$ is the voltage level of the floating gate (poly 1) 40.

$V_{p2}$ is the voltage level of the erase region (poly 2) 52.

$V_{p3}$ is the voltage level of the word line (poly 3) 60.

$V_b$ is the voltage level of the substrate.

$V_d$ is the voltage level of the drain terminal.

$C_{p1}$ is the floating gate to substrate capacitance.

$C_d$ is the floating gate to drain capacitance.

$C_{p2p1}$ is the floating gate to erase region capacitance (poly 2/poly 1).

$C_{p3p1}$ is the floating gate to word line capacitance (poly 3/poly 1).

The capacitance $C_{p1}$, $C_{p3p1}$, $C_{p3p2}$ are shown symbolically on FIG. 4A by the capacitor symbols 90.

In the present embodiment, the area of $C_{p2p1}$ is ¼ to ⅓ the area of $C_{p3p1}$ to reduce coupling from the poly 2 layer 50 and the floating gate (poly 1) 40 and to maximize the electric field across the oxide needed for tunneling.

The value of the capacitances are determined by the formula:

$$C = \frac{EA}{t_{ox}} \quad (1)$$

where E is the dielectric constant of the oxide, A is the area of the capacitor, and $t_{ox}$ is the thickness of the oxide.

The value of the floating gate potential is determined by the equation:

$$V_{p1} = \frac{q_{p1} + (V_{p3}C_{p3p1} + V_{p2}C_{p2p1} + V_dC_d + V_bC_{p1})}{C_{p3p1} + C_{p2p1} + C_d + C_{p1}} \quad (2)$$

When the floating gate is charged, $q=(-Q_1)$ and when the floating gate is erased $q=0$.

In FIG. 4A, the upper surface of the floating gate (poly 1) erase segment 44C, disposed below the erase region 54 of the poly 2 layer, is shown textured with bumps and sharp edges 91. These bumps and sharp edges 91 are not drawn to scale but are greatly enlarged to illustrate the effect. These bumps and sharp edges 91 are called asperities and greatly increase the efficiency of electron tunnelling from the erase segment 44C to the erase region 54. Note that the surface of the floating gate 40 not disposed below the erase region 52 is depicted as being smooth or planar. The lack of asperities 91 below the word line (poly 3) segment 62D reduces the probability of unwanted tunneling of electrons from the floating gate 40C to the word line 62D.

FIG. 5 is a schematic diagram depicting a memory transistor of an E²PROM cell. This schematic diagram corresponds to the physical structure depicted in FIG. 3. Referring now to FIG. 5, memory transistor M1 100 comprises terminals T1 and T2, channel 22, floating gate 40, and control gate 60. Terminals T1 and T2 correspond to the first and second diffusion regions 20A and 20B of FIG. 3. Terminal T1 is coupled to the second bit line 80B and T2 is coupled to the third bit line 80C. The channel is divided into two sections, Q1 and Q2. Region Q1 is under control of the floating gate 40 and the programming control section 60C of the word line segment 62D. Region Q2 is under the control of the enhancement section 60E of the word line segment 62D.

A read operation for memory transistor 100 will now be described. Prior to a read operation, all the bit lines in the array are biased at about 2V by column pullup transistors (not shown) at the edge of the chip. During the read operation for transistor M1, the third bit line 80C is pulled to ground thereby causing T2 to be biased at about 0V. T2 thus functions as the source of transistor M1.

The second bit line 80B is coupled to a sense amp by a column decoder at the chip edge and pulled to about 2V. The second word line 60B is pulled to about 5V. If the floating gate 40C is unprogrammed then $V_{TH}$ is about 1.8V, $V_{p3}$ is 5V and current will flow from T1 to T2. The voltage on the second bit line 80B will then drop to about 1.2V. This voltage drop is detected by the sense amp and indicates that a first binary state is stored in the cell.

If the floating gate 40 is programmed then the $V_{TH}$ is about 6V and $V_{p3}$ is about 5V and only a very small current flows from T1 to T2. The second bit line 80B remains at about 2V indicating to the sense amp that a second binary state is stored in the cell.

A programming operation will now be described with reference to FIG. 5. In a program operation, electrons are transferred from the channel 22 to the floating gate 40. During the programming operation, T1 is pulled to about 8 volts by the second bit line 12, T2 is held near ground by the third bit line 14, and the second word line 60B is pulled to about 12.5 volts. Accordingly, T1 functions as the drain and T2 functions as the source of the memory transistor 100. Electron current flows from T2 to T1. From FIG. 4B and Equation 2, if $V_s=0$, $V_d=8$ v, $V_{p3}=12.5$V, $V_{p2}=0$, then $V_{p1}=4.45$ v.

The velocity of the electrons increases as the electrons travel towards T1 and, in the region of the channel denoted HE 92, hot electrons are scattered from lattice sites in the silicon crystal. The voltage on the floating gate 40, $V_{p1}=4.45$ v, creates an electric field normal to the channel 22. This field causes the scattered hot electrons to penetrate the oxide layer positioned between the channel 22 and the floating gate 40, thereby causing electron buildup on the floating gate 40. Accordingly, the floating gate 40 becomes negatively charged and is programmed.

If the voltage levels on the terminals are reversed, i.e., T2 is pulled to eight volts and T1 is pulled to ground, the floating gate 40 will not be programmed. As described above, hot electrons scattering does not occur until the electrons are near the drain end of the channel. For this case, the drain end of the channel is close to T2 and is not disposed under the floating gate. Accordingly, the hot electrons scattered from the lattice will not be collected by the floating gate and the floating gate will not be charged.

Thus, the memory transistor M1 100 is not symmetrical with regard to the programming operation. This asymmetry is utilized in the present invention to greatly increase the density of the memory array. This utilization of the asymmetry will now be described more fully with reference to FIG. 6. FIG. 6 is a circuit diagram corresponding to the layout depicted in FIG. 3. In FIG. 6, T1 corresponds to the first diffusion region 20A; T2 corresponds to the second diffusion region 20B, and so on. Memory transistor M1 couples T1 and T2; M2 couples T1 and T3; M3 couples T1 and T4; and M4 couples T1 and T5. Note that transistors M1 and M4 share the same word line, WL2, 60B and also a common bit line, BL2 80B. The asymmetry of the memory transistors M1-M4, described above, allows the second BL2 80B to serve as both a ground (source) line and a programming voltage (drain) line to the transistors M1 and M4.

Consider the programming of transistor M1, i.e., of the second floating gate 40C, wherein WL2 is pulled to twelve volts, BL2 80B is pulled to about eight volts, and BL1 and BL3 80A and 80C are held at ground. Terminal T1 thus functions as the drain for transistor M1 and hot electrons are scattered into the floating gate 40C of transistor M1 thereby programming the third floating gate 40C. T1 also functions as the drain for transistor M4, however, since the second floating gate 40B of transistor M4 is not disposed near the drain terminal, T1, the hot electrons are not collected by the floating gate 40B and the second floating gate 40B is not programmed. Thus, the importance of the positioning of the program sections 42 of the floating gates 40 in the geometry described with reference to FIG. 2 is now apparent. Each bit line in the array functions as a ground (source) line for a pair of memory transistors, e.g. M1 and M4, disposed on either side of the bit line during a program operation.

The erase mode of the present invention will now be described. In an erase operation, electrons are removed from the floating gate 40 so that the resulting charge on the floating gate 40 is about zero Coulombs.

As is known in the art, during the erase operation it is possible to pull the floating gate 40 positive relative to the channel 22. This positive floating gate state causes a depletion channel to form under the floating gate 40. However, no current flows when the word line 60B is at zero volts because of the presence of the enhancement section 60E in the memory transistor 100. The $V_{TH}$ of the enhancement section 60E is about 1.8V.

As described above with reference to FIG. 2, each erase section 54 of the poly 2 layer 50 is disposed over the erase segments 44 of four separate floating gates 40. The isolation regions 24L under the erase sections 52 are slightly larger than the isolation regions under bit lines adjacent to the poly 2 layer 50 to facilitate this grouping of erase sections. The collection of four erase segments under each erase region 54 of the poly 2 layer 50 greatly reduces the space in the array dedicated to the erase function.

During an erase operation, the poly 2 layer 50 is pulled to about 15 volts while the WLs and BLs are held near ground. From FIG. 4B and Equation 2, if $V_b=0$, $V_d=0$, $V_{p3}=0$, and $V_{p2}=15V$, then $V_{p1}$ equals about 1.11V. Thus the voltage difference, $V_{p2}-V_{p1}$, is 15 v $-1.1$ v or about 14 v.

An important feature of the present system is the disposition of the erase segment 54 of the poly 2 layer 50 above the erase segments of the floating gates 40. As is known in the art, the top surface and edges of a polysilicon layer tends to be of convex curvature while the bottom surface tends to be of concave curvature. The voltage difference between two poly layers to effect electron tunneling from a convex layer to a concave layer is less than that required to effect tunneling from a concave layer to a convex layer. Accordingly, the orientation of the erase section 54 above the erase segment 44 of the floating gates 40 utilizes the advantage of tunneling from a convex to a concave layer. Thus, an erase voltage of only about 14 or 15 volts is required. The magnitude of the erase voltage required is lower than the erase voltage requirements in existing E$^2$PROM architectures.

The terminal T1, that is the first diffusion region 20A, functions as a terminal for the four transistors M1–M4. During a read operation, T1 may function as the source or drain terminal of any of the transistors. During a program operation, T1 may function as the drain for transistors M1 and M3 and the source for transistors M2 and M4.

Because each terminal, i.e., diffusion region 20, is included in four memory cells, the number of diffusion regions coupled to each bit line 80 in the present embodiment is reduced compared to existing arrays having the same number of cells.

Charging any bit line 80 to a selected bias voltage requires that all the diffusion regions 20, coupled to the bit line 80, also be charged to the selected bias voltage. Thus, the bit line capacitance, $C_{BL}$, is dependent on the number of diffusion regions coupled to the bit line. In the present embodiment, $C_{BL}$ is thus reduced compared to existing arrays because of the reduced number of diffusion regions 20 in the architecture.

This lowered $C_{BL}$ reduces chip access time. For example, in the standby mode, when the chip is deselected, the bit lines in the array are charged to the drain voltage. During a read, the source line must be pulled to 0V. The time it takes to pull the course line low depends on $C_{BL}$ and is a component of the chip access time. Accordingly, in the present invention, the chip access time is decreased because $C_{BL}$ is decreased.

Generally, all the cells (floating gates) in the array are erased during an erase operation. However, a one-byte erase mode may also be implemented in the present architecture. A selected byte is defined as a selected number of the floating gates disposed under a selected word line 60.

For example, in FIG. 6, the selected byte is eight floating gates 40 disposed under the second word line 60B. These floating gates 40 are spaced at arbitrary intervals under the word line 60. For purposes of this example, assume that the third floating gate 40C is the first floating gate in the byte and that the other seven floating gates are disposed under the extension of the second word line 60B to the right of FIG. 6.

To erase the selected byte, the erase line 50 disposed under the second bit line 80B, and the eight other erase lines disposed to the right of the second bit line 80B in the extension to the right of FIG. 6, are pulled to about 15 volts. The second word line 60B is held at ground and all other word lines are pulled to about 12.5V.

Under the above conditions, the floating gates 40 in the selected byte are erased normally. Additionally, the floating gates disposed just to the left and to the right of the floating gates 40 of the selected byte are unavoidably erased. In this example, the second floating gate 40B, disposed just to the left of the floating gate 40C in the selected byte is erased because it is coupled to the erase line 50 under the second bit line 80B and is disposed under the second word line 60B. Loss of data is prevented by reading the states of these unavoidably erased floating gates 40 into a register prior to the erase operation. The register data is reprogrammed into the floating gates subsequent to the erase operation.

The increased density of the present E$^2$PROM architecture results from the following features. The zigzag word lines 60 allow the erase regions of four independent floating gates to be collected under one erase region of the poly 2 layer, thus the erase window of the present architecture occupies much less area than the erase windows of existing E$^2$PROM architectures. Secondly, the low erase voltage requirements of the present architecture facilitate isolation of closely packed diffusion regions. Next, the utilization of each bit line as mutual ground for memory transistors on either side of the bit line reduces the density of the metallizations required in the architecture thereby increasing density. Additionally, the number of diffusion regions is reduced because each diffusion region functions as terminal in four memory cells.

The architecture of the present system also increases the speed with which a memory cell can be accessed. The zigzag word line configuration results in the horizontal segments of the word lines being disposed above thick oxide isolation regions. Accordingly, the capacitance of the word line is greatly reduced so that the word line may be charged to the appropriate voltages of the various operating modes quickly. Further, the metal bit lines are only coupled to isolated diffusion regions and thus have a low capacitance.

The low voltage requirement of the present architecture also decreases the bipolar latch-up problems inherent in the CMOS peripheral circuits utilized on the memory chip.

Further, the zigzag word lines and channels disposed at 45° relative to the vertical and horizontal axes reduce misalignment problems. During fabrication, the masks used for photolithography are aligned with respect to X and Y markers on the edge of a wafer. Any displacement along the vertical or horizontal axis only effects the orientation of the channel or plus and minus segments of the word lines by the actual displacement multiplied by the cosine of 45°. Accordingly, the misalignment is reduced by a factor of about 30%.

Exemplary processing steps for fabricating an embodiment of the E$^2$PROM cell of the present invention will now be described with reference to FIGS. 7–10. FIGS. 7 and 8 are cross sectional views of the E$^2$PROM cell taken along the line 3—3' of FIG. 2. FIGS. 9 and 10 are cross-sectional views along the line 4—4' of FIG. 2.

Referring now to FIG. 7, the diffusion regions 20A and 20B and channel region 22E are formed by diffusion region implants and threshold implants, respectively, along the surface of a P$^-$ doped silicon substrate 200. The P$^+$ implant increases the channels unprogrammed threshold to about $V_{TH}=1.8V$.

Referring now to FIG. 8, a 350 Angstrom gate oxide layer 210 is grown by a wet or dry oxide process well known in the art. The floating gate 40 is formed by depositing and etching a polysilicon layer utilizing standard mask and etching techniques.

An N$^+$ drain implant 212 is formed by an N ion implantation step utilizing the edge of the floating gate 40 as a mask. Thus, the drain implant 212 is self-aligned to the floating gate 40. This drain implant 212 contributes to the asymmetry of the programming mechanism (described above) by positioning the pinch-off region of the transistor 100 under the floating gate 40.

Referring now to FIG. 9, a 650 Angstrom silicon dioxide layer 214 is grown on the upper surface of the floating gate 40 utilizing the wet oxide process. The erase region (poly 2) 54 is formed over the isolation regions 24 by standard masking and etching processes. The section of the oxide region 214 not overcoated by the erase region 54 is removed from the surface of the floating gate 40 by a selective etching process well known in the art. The etchant utilized in this selective etching process etches silicon dioxide at a much higher rate than the polycrystalline silicon. Thus, the erase region polysilicon layer 54 protects the oxide disposed therebelow and prevents it from being etched during this step. Accordingly, the final structure, as depicted in FIG. 9, results in the surface of the floating gate 40 being exposed except for the region, i.e., the program segment 44C, disposed below the erase region 54.

Alternatively, this removal of the oxide from the surface of the floating gate 40 can be achieved utilizing standard mask and etching processes.

Next, the exposed region of the floating gate 40 is implanted with phosphorus or arsenic to eliminate and planarize the top surface and sharp edge of the exposed floating gate region. However, as depicted in FIG. 9, the top surface of the floating gate 40 disposed under the erase region 54 is nonplanarized and covered with asperities 91. Thus, the nonplanar convex surface and asperities of the erase segment 44C coupled with the high-quality tunneling oxide separating the erase segment 44C from the erase region 54 contribute to a very low erase voltage needed to induce tunneling from the erase segment 44C to the erase region 54.

Referring now to FIG. 10, an oxide layer 216 is grown over the exposed floating gate region and has a thickness of about 600 Angstroms. This oxide region 216 will separate the floating gate 40 from the word line (poly 3) 60. A very thick oxide layer is grown over the surface of the erase region (poly 2) 54.

Next, a third polysilicon region is deposited over the entire structure and the word lines 60 are formed by standard mask and etching processes. Metal interconnects and other lines are then formed utilizing standard techniques.

Preferred embodiments of the invention have now been described. Various substitutions and alterations to these embodiments will be apparent to persons of skill in the art apprised of the teachings of this patent. It is therefore not intended that the invention be limited to the described embodiments, but that the invention be defined by the appended claims.

What is claimed is:

1. In an E$^2$PROM array, having a plurality of bit lines oriented substantially parallel to a bit line axis, with said array including N E$^2$PROM cells formed along the surface of a silicon substrate of a first conductivity type, an architecture for reducing the area of the array and for decreasing bit line capacitance comprising:
   a terminal diffusion region of a second conductivity type disposed along the surface of said substrate, said terminal diffusion region being a terminal of four E$^2$PROM cells.

2. In an E$^2$PROM array, having a plurality of bit lines oriented substantially parallel to a bit line axis, with said array including N E$^2$PROM cells formed along the surface of a silicon substrate of a first conductivity type, an architecture for reducing the area of the array comprising:
   four floating gates, with each of said floating gates included in a corresponding E$^2$PROM cell and with each floating gate having a programming section and an erase section disposed about the same axis; and
   an erase polysilicon structure having erase regions coupled by connecting regions, with said four floating gates oriented so that the erase sections of said floating gates are vertically displaced under said erase region.

3. The invention of claim 2 wherein:
   said erase region is disposed over the erase segments of said floating gates.

4. The invention of claim 3 wherein:
   the upper surface and edges of the erase segment of the floating gate is covered with bumps and rough edges and the upper surface and edges of the programming segment of the floating gate is smoother than the upper surface and edges of the erase segment.

5. In an E$^2$PROM array, having a plurality of bit lines oriented substantially parallel to a bit line axis, an E$^2$PROM cell, formed along the surface of a silicon substrate of a first conductivity type, comprising:
   a first terminal region, of a second conductivity type, formed along the surface of said substrate;

a second terminal region, of a second conductivity type, formed along the surface of said substrate;

a channel separating said first and second terminal regions, said channel being a region, of the first conductivity type, of said substrate disposed substantially symmetrically about a channel axis, with said channel axis oriented about 45° from said bit line axis;

a first isolation region formed along the surface of said substrate, with a first end of said channel terminated at said first isolation region;

a second isolation region formed along the surface of said substrate, with a second end of said channel terminated at said second isolation region;

a word line, being a polysilicon structure disposed over said substrate, with said word line having a first substantially rectangular segment with an edge oriented at about 90° from said BL axis and positioned over said first isolation region, a second substantially rectangular segment having an edge oriented about parallel to said channel axis and positioned over said channel, and a third substantially rectangular segment with an edge oriented at about 90° from said BL axis and positioned over said second isolation region;

a floating gate, being a polysilicon structure disposed over said substrate and below said word line, having a substantially rectangular programming section disposed over said channel and an erase section disposed over said first isolation region, said programming section having a first edge and second edge disposed about parallel to said channel axis, with the first edge being closer to said first terminal region than the second edge is to said second terminal region; and an erase region, being a polysilicon structure disposed over said first isolation region and positioned between said erase section of said floating gate and said word line.

6. An E²PROM memory array of the type formed on a silicon substrate of a first conductivity type and including memory transistors having source and drain diffusion regions of a second conductivity type, formed on the surface of the substrate, with the source and drain diffusion regions separated by a channel being a region of the substrate of the first conductivity type, said memory array comprising:

first, second, third, and fourth substantially parallel and substantially equidistantly spaced bit lines disposed over the surface of said substrate, with each bit line defining a corresponding first, second, third, and fourth bit line axis with the bit line axes defining a vertical direction along the memory array;

a first oxide isolation region disposed substantially symmetrically about said first bit line access;

a second oxide isolation region disposed substantially symmetrically about said first bit line axis;

a third isolation region disposed substantially symmetrically about said second bit line axis, with said third isolation region positioned along said second bit line axis so that a first minus axis, oriented at −45° relative to said bit line axis, intersects both said first and third isolation regions and also positioned so that a first plus bit line axis, oriented at +45° relative to said bit line axes, intersects both said second and third isolation regions;

a fourth isolation region disposed substantially symmetrically about said second bit line axis, with said fourth isolation region positioned along said second bit line axis so that a second minus axis, oriented at −45° relative to said bit line axes, intersects both said second and fourth isolation regions;

a fifth isolation region disposed substantially symmetrically about said third bit line axis, with said fifth isolation region positioned along said third bit line axis so that said first plus axis, oriented at +45° relative to said bit line axes, intersects said second, third, and fifth isolation regions;

a sixth isolation region disposed substantially symmetrically about said third bit line axis, with said sixth isolation region positioned along said third bit line axis so that a second plus axis, oriented at +45° relative to said bit line axes, intersects both said fourth and sixth isolation regions and also positioned so that said first minus bit line axis, oriented at −45° relative to said bit line axes, intersects said first, third, and sixth isolation regions;

a seventh isolation region disposed substantially symmetrically about said fourth bit line axis, with said seventh isolation region positioned along said fourth bit line axis so that said second plus axis, oriented at +45° relative to said bit line axes, intersects said fourth, sixth, and seventh isolation regions and so that a third minus axis, oriented at −45° relative to said bit line axes, intersects said fifth and seventh isolation regions;

a first substantially rectangular channel lengthwise oriented along said first minus axis with said first channel terminated at one end by said first isolation region and at the other end by said third isolation region;

a second substantially rectangular channel lengthwise oriented along said first plus axis with said second channel terminated at one end by said second isolation region and at the other end by said third isolation region;

a third substantially rectangular channel lengthwise oriented along said second minus axis with said third channel terminated at one end by said second isolation region and at the other end by said fourth isolation region;

a fourth substantially rectangular channel lengthwise oriented along said first plus axis with said fourth channel terminated at one end by said third isolation region and at the other end by said fifth isolation region;

a fifth substantially rectangular channel lengthwise oriented along said first minus axis with said fifth channel terminated at one end by said third isolation region and at the other end by said sixth isolation region;

a sixth substantially rectangular channel lengthwise oriented along said second plus axis with said sixth channel terminated at one end by said fourth isolation region and at the other end by said sixth isolation region;

a seventh substantially rectangular channel lengthwise oriented along said third minus axis with said seventh channel terminated at one end by said fifth isolation region and at the other end by said seventh isolation region;

an eighth substantially rectangular channel lengthwise oriented along said second plus axis with said eighth channel terminated by said sixth and seventh isolation regions;
a first N+ diffusion region formed along the surface of said semiconductor substrate with said first diffusion region bounded by and electrically isolated from all other diffusion regions in the array by said second, third, fifth, and sixth channels and by said second, third, fourth, and sixth isolation regions;
a second N+ diffusion region formed along the surface of said semiconductor substrate with said second diffusion region bounded by and electrically isolated from all other diffusion regions in the array by said fourth, fifth, seventh, and eighth channels and by said third, fifth, sixth, and seventh isolation regions;
a first word line positioned over said substrate, said first word line having a first horizontal segment disposed over said first isolation region, a second segment disposed over said first channel and oriented along said first minus axis, a third horizontal segment disposed over said third isolation region, a third segment disposed over said fourth channel and oriented along said first plus axis and a fourth horizontal segment disposed over said fifth isolation region, said first word line having an inside edge, being the edge adjacent to said second diffusion region, and an outside edge;
a second word line positioned over said substrate, said second word line having a first horizontal segment disposed over said second isolation region, a second segment disposed over said second channel and oriented along said first plus axis, a third horizontal segment disposed over said third isolation region, a fourth segment disposed over said fifth channel and oriented along said first minus axis and a fifth horizontal segment disposed over said sixth isolation region, said second word line having an inside edge, being the edge adjacent to said second diffusion region, and an outside edge;
a first floating gate having a rectangular programming segment positioned below said second segment of said first word line and above said first channel, with said programming segment positioned nearest to the outside edge of said first word line, and with said first floating gate also having an erase segment disposed below the third segment of said first word line and above said third isolation region;
a second floating gate having a rectangular programming segment positioned below said second segment of said second word line and above said second channel, with said programming segment positioned nearest to the inside edge of said second word line, and with said second floating gate also having an erase segment disposed below the third segment of said second word line and above said third isolation region;
a third floating gate having a rectangular programming segment positioned below said fourth segment of said second word line and above said fifth channel, with said programming segment positioned nearest to the outside edge of said second word line, and with said third floating gate also having an erase segment disposed below the third segment of said second word line and above said third isolation region;
a fourth floating gate having a rectangular programming segment positioned below said fourth segment of said first word line and above said fourth channel, with said programming segment positioned nearest to the inside edge of said first word line, and with said fourth floating gate also having an erase segment disposed below the third segment of said first word line and above said third isolation region; and
an erase poly region, having a boundary substantially congruent to the boundary of said third isolation region, disposed above the erase segments of said first, second, third, and fourth floating gates and disposed below the third segments of said first and second word lines.

* * * * *